United States Patent [19]

Stedman et al.

[11] Patent Number: 5,543,751
[45] Date of Patent: Aug. 6, 1996

[54] POWER COMBINER FOR USE IN A RADIO FREQUENCY SYSTEM AND A METHOD OF CONSTRUCTING A POWER COMBINER

[75] Inventors: Robert B. Stedman, Hoffman Estates; John E. Matz, Hanover Park, both of Ill.

[73] Assignee: Motorola, Inc., Schaumburg, Ill.

[21] Appl. No.: 505,092

[22] Filed: Jul. 21, 1995

[51] Int. Cl.$^6$ .................................................. H03F 3/68
[52] U.S. Cl. .............................. 330/124 D; 330/124 R; 333/128
[58] Field of Search ................................ 333/127, 128; 330/53, 124 R, 286, 295, 302, 124 D

[56] References Cited

U.S. PATENT DOCUMENTS

| | | | |
|---|---|---|---|
| 4,780,685 | 10/1988 | Ferguson | 330/124 D |
| 5,025,225 | 6/1991 | Tajima et al. | 330/124 D |

FOREIGN PATENT DOCUMENTS

0540286A1  10/1992  European Pat. Off. .

OTHER PUBLICATIONS

Ulrich H. Gysel, A New N–Way Power Divider/Combiner Suitable for High Power Applications, 1975 116–118. No Month.
D. I. Stones, A UHF 16–Way Power Combiner Designed by Synthesis Techniques, Microwave Journal, Jun. 1989, 117–120.
Earnest Franke, Excess Insertion Loss at the Input Ports of a Combiner Hybrid, RF Design, Nov. 1985, 43–48.
Ernest J. Wilkinson, An N–Way Hybrid Power Divider, Jan. 1960, IEEE Trans. Microwave TaT; pp. 116–118.
Adel Saleh, Planar Electrically Symmetric n–Way Hybrid Power Dividers/Combiners, 1980 IEEE 555–563. No Month.
Gage and Hazen, Design and Performance of a 16–way combiner using 1/16 wavelength microstrip transmission lines, 451–461. No Date.
Galani and Temple, A Broadband Planar N–Way Combiner/Divider, 499–502. No Date.
Groff and MacGahan, Combine High Power Levels at VHF and UHF, Design Feature, Dec. 1990 100–108.
Cohn, Geller and Schellenberg, A 10–Watt Broadband FET Combiner/Amplifier, 292–296. No Date.

*Primary Examiner*—Steven Mottola
*Attorney, Agent, or Firm*—Jeffrey G. Toler

[57] ABSTRACT

A power combiner including a plurality of phasing transmission lines (122) supporting a set of amplifiers (104) coupled thereto, and a plurality of matching transmission lines (124). The set of amplifiers (104) having a selectable number of amplifiers between a minimum and a maximum value. Each of the matching transmission lines (124) is coupled to one of the phasing transmission lines (122) at one end and coupled to a common node (126) at the other end. Each of the matching transmission (124) lines has a substantially equivalent characteristic impedance determined according to a function of the minimum and the maximum number of amplifiers in the set of amplifiers (104).

18 Claims, 3 Drawing Sheets

EXTENDED LINEAR POWER AMPLIFIER IN A BASE SITE OF A RADIO SYSTEM

PHASING LINES   MATCHING LINES

POWER COMBINER FOR USE IN A RADIO FREQUENCY SYSTEM AND A METHOD OF CONSTRUCTING A POWER COMBINER

FIELD OF THE INVENTION

The present invention relates generally to radio frequency systems and, more particularly, to power combiners for use in a radio frequency system.

BACKGROUND OF THE INVENTION

Extended linear power amplifier systems have been proposed for use in cellular base stations. These systems include a number of linear power amplifier modules producing a corresponding number of output signals that need to be combined into a single high power signal before transmission. Such systems are typically used in communication systems such as in a base site of a radiotelephone system. In such systems, it is desirable that the number of linear power amplifier modules may be any number from a minimum number up to a maximum number of allowable amplifiers. In this manner, the amount of power output by the transmission unit of the base station may be adjusted. In addition, it is desirable that the system provides adequate power amplification efficiency across the entire range of selected amplifiers, i.e. from the minimum number to the maximum number of amplifiers.

However, conventional power combiners, such as Wilkinson type combiners, are only efficient when all of the available amplifiers are present, and rapidly become less efficient due to impedance mismatch and resistive circuit elements when less than the maximum number of amplifiers are selected. For example, a Wilkinson type 10:1 combiner will only be 10% efficient when a single amplifier is coupled to the combiner. This poor efficiency at less than maximum amplification is undesirable for extended linear amplifier applications.

A proposed device for addressing this problem is described in European Patent EP 0540286 A1 ("the '286 patent"). The '286 patent describes a two step impedance transformation process that may be used to design a combiner that has a maximum efficiency at a selectable integer number of installed amplifiers. The integer is selected between the minimum number and the maximum number of amplifiers. Although the described combiner of the '286 patent appears to operate more efficiently than the Wilkinson type combiner, the '286 patent has deficiencies. Forcing the maximum efficiency to be at a selected integer produces sub-optimal performance over a typical range from a minimum to a maximum number of amplifiers since the optimum efficiency location is usually not at an integer value.

Accordingly, there is a need for an improved power combiner that maintains a high efficiency across the entire range of amplifiers that may be coupled to the combiner without degrading the useful bandwidth of the combiner.

SUMMARY OF THE INVENTION

The present invention addresses this need by providing a power combiner and a method of constructing a power combiner for use in a radio frequency system. According to an aspect of the present invention, the power combiner comprises a plurality of phasing transmission lines supporting a set of amplifiers coupled thereto, and a plurality of matching transmission lines. The set of amplifiers has a selectable number of amplifiers between a minimum and a maximum value. In the preferred embodiment, each of the phasing transmission lines has a substantially equivalent length of one-quarter of a wavelength and a characteristic impedance equal to the system characteristic impedance. Each of the matching transmission lines is coupled to one of the phasing lines at one end and coupled to a common node at the other end. Each of the matching transmission lines has a substantially equivalent length of one-quarter of a wavelength, and a characteristic impedance determined according to a function of the minimum and the maximum number of amplifiers in the set of amplifiers. Preferably, the function comprises the fourth root of the minimum number times the maximum number of amplifiers in the set.

According to a further aspect of the present invention, the power combiner comprises a plurality of phasing transmission lines supporting a set of amplifiers, and a transforming line coupled to each of the phasing transmission lines. The set of amplifiers has a selectable number of amplifiers between a minimum and a maximum value. Each of the phasing transmission lines has a length substantially equal to one half of a wavelength and a characteristic impedance equal to the system characteristic impedance. The transforming line has a length equal to one-quarter of a wavelength and a characteristic impedance determined according to a function of the minimum and the maximum number of amplifiers in the set of amplifiers. Preferably, the function comprises a reciprocal of the fourth root of the minimum number times the maximum number of amplifiers in the set.

According to a further aspect of the present invention, the method of constructing a power combiner includes the steps of providing a plurality of parallel phasing transmission lines supporting a set of amplifiers coupled thereto, providing a plurality of matching transmission lines, and determining a characteristic impedance of the matching transmission lines according to a nonlinear function of the minimum and the maximum number of amplifiers in the set of amplifiers. The set of amplifiers has a selectable number of amplifiers between a minimum and a maximum value. Each of the matching transmission lines is coupled to one of the phasing lines at one end and coupled to a common node at the other end. Each of the matching transmission lines has a substantially equivalent characteristic impedance.

The invention itself, together with its attendant advantages, will best be understood by reference to the following detailed description, taken in conjunction with the accompanying drawings.

DETAILED DESCRIPTION OF THE PREFERRED EMBODIMENTS

Figure 1:
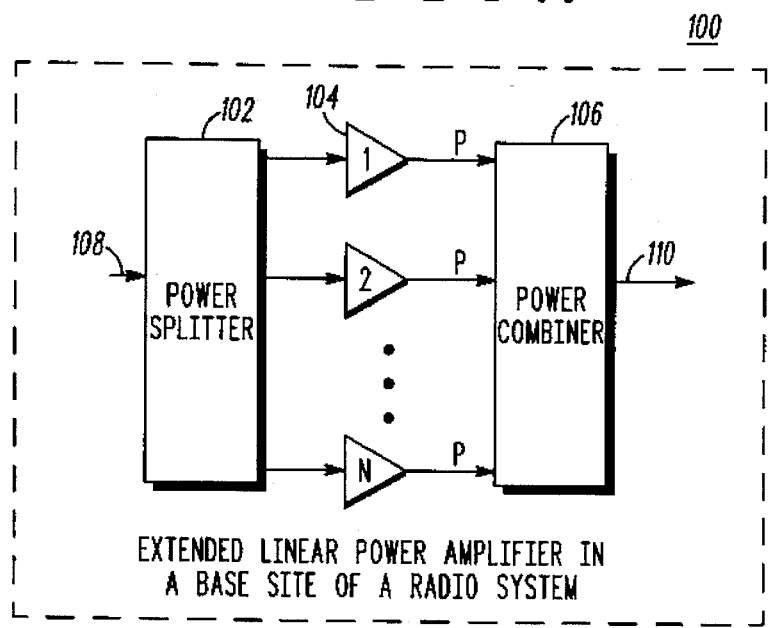
FIG. 1 is a block diagram of a radio frequency circuit with a splitter and power combiner according to a preferred embodiment of the present invention.

Referring now to FIG. 1, a radio frequency (the "RF") circuit including a power splitter and power combiner 100 is illustrated. The power splitter and power combiner circuit 100 includes a power splitter circuit 102, a set of amplifiers 104, and a power combiner 106. The power splitter 102 receives an input signal 108 that is to be split into a plurality of output signals. The plurality of output signals from the power splitter 102 are fed into individual power amplifiers within the set of power amplifiers 104. The output of the power amplifiers 104 are each fed into the power combiner 106. The combiner 106 receives each of the outputs from the set of amplifiers 104 and produces an output signal 110. In the preferred embodiment, the power splitter 102 is coupled to the set of amplifiers 104, which in turn are coupled to the power combiner 106. A circuit for performing either of the functions of the power splitter 102 or the power combiner 106 according to a preferred embodiment will now be illustrated with respect to FIG. 2. For convenience, such a circuit will be referred to as a power combiner even though the circuit may also be configured as a power splitter.

Figure 2:
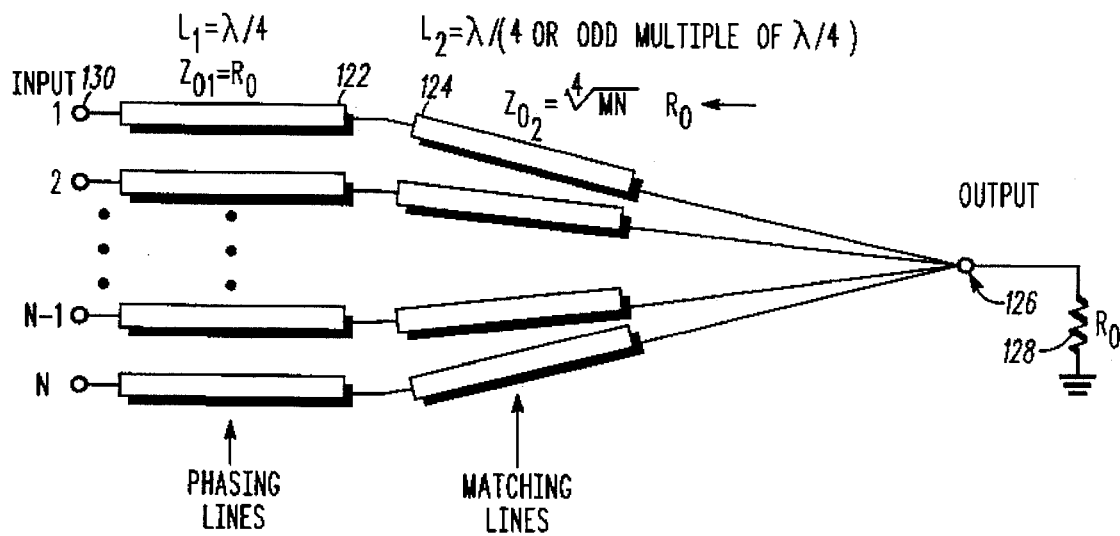
FIG. 2 is a schematic diagram of a preferred embodiment of the power combiner of FIG. 1.

Referring to FIG. 2, a power combiner 120 according to a preferred embodiment is illustrated. The power combiner 120 includes a plurality of phasing transmission lines 122, a plurality of matching transmission lines 124, a common node 126, an output load 128, and a set of input nodes 130. The set of input nodes 130 are each coupled to an amplifier within the set of amplifiers 104. Each of the phasing transmission lines 122 is connected to one of the input nodes 130 at one end and is connected to one of the matching transition lines 124 at the other end. Each of the phasing transmission lines 122 has a characteristic impedance which is substantially equivalent to the output load 128. In this example, since the output load has an impedance of 50 Ohms, each of the phasing transmission lines has a characteristic impedance of about 50 Ohms. Also, each of the phasing transmission lines 122 has a length which is equal to a quarter wavelength.

Each of the matching transmission lines 124 is connected to the common node 126. In addition, each of the matching transmission lines 124 has a length which is equal to a quarter wavelength or an odd multiple thereof. Further, each matching transmission line 124 has a characteristic impedance determined according to a function of the minimum and maximum number of amplifiers in the set of amplifiers 104. In the preferred embodiment the function is a nonlinear function. Most preferably, the function is the fourth root of the product of the minimum number of amplifiers and the maximum number of amplifiers, which is then multiplied by the load impedance 128. However, other nonlinear functions, such as a cube root function although not as optimal as the fourth root function will also provide suitable performance. This formula is illustrated in FIG. 2 adjacent to the matching transmission lines 124. The common node 126 is connected to each of the matching transmission lines 124 and is also connected to a load, typically a 50 Ohm resistance 128. Although the above description with reference to FIG. 2 illustrates a power combiner 106, the circuit 120 is also suitable for use as the power splitter 102.

Figure 3:
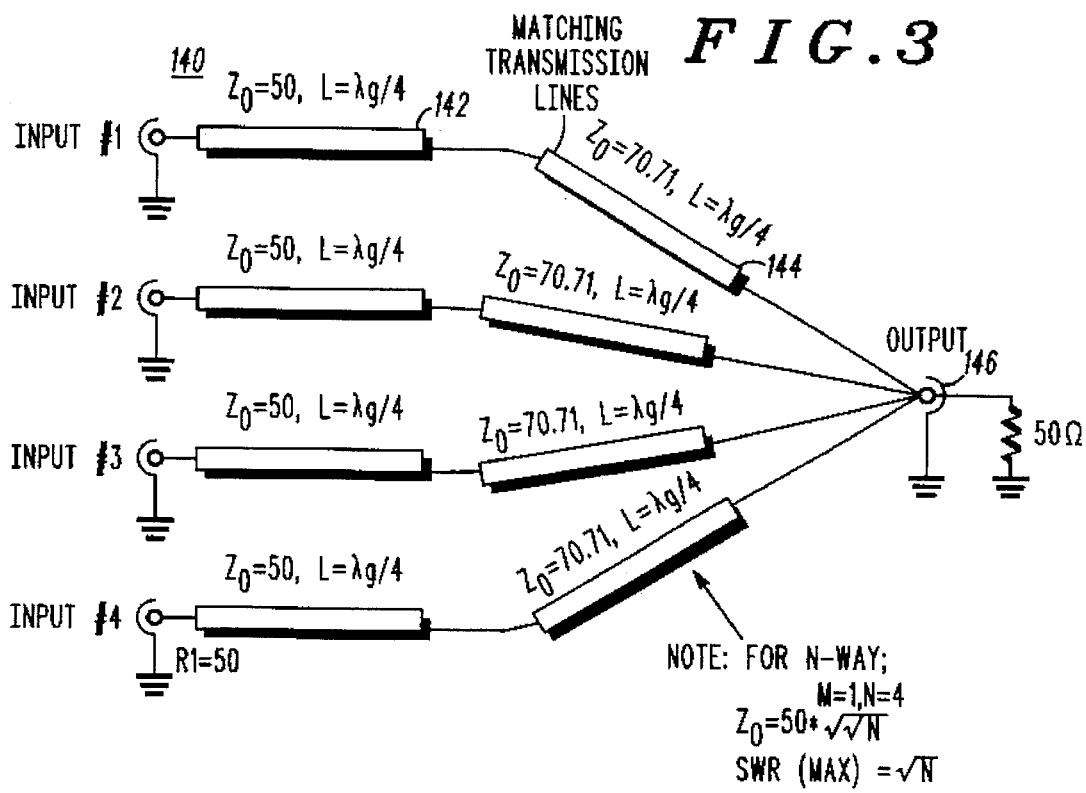
FIG. 3 is a schematic diagram of a preferred embodiment of a four input power combiner.

Referring to FIG. 3, an example of a power combiner 140 having a minimum of one amplifier and a maximum of four amplifiers is illustrated. The combiner 140 includes four phasing transmission lines 142, four matching transmission lines 144, and a common node 146. Each of the phasing transmission lines 142 has an impedance of 50 Ohms and a length equal to a quarter wavelength. Each of the matching transmission lines has a length of a quarter wavelength and has a characteristic impedance of about 70.71 Ohms. The impedance of the matching transmission lines 144 is determined according to the preferred fourth root formula described above. Those skilled in the art will appreciate that the power combiner circuit 140 has many advantages. For example, the power combiner circuit 140 provides for improved power and efficiency across a range of amplifiers that may be connected to the combiner 140. Further, the preferred circuit 140 provides improved efficiency without degrading the useful bandwidth of the combiner.

Figure 4:
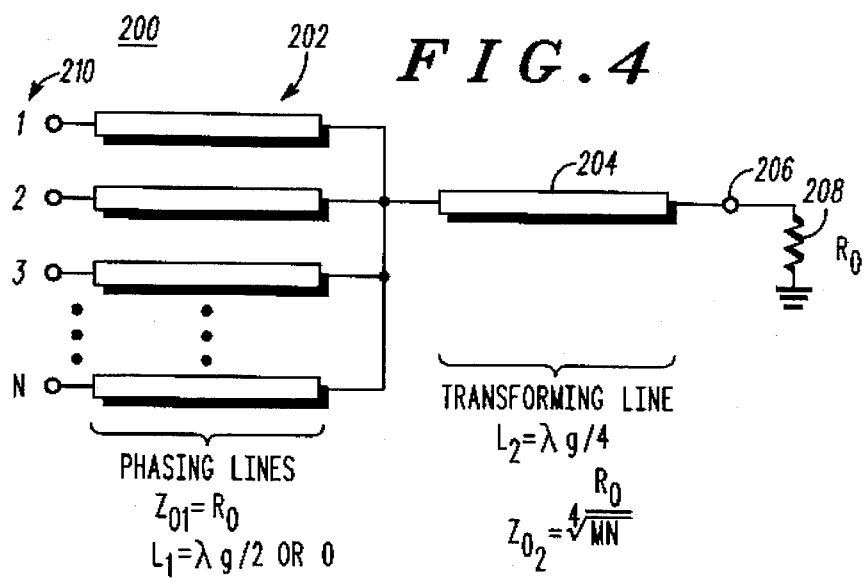
FIG. 4 is a schematic diagram of another preferred embodiment of the power combiner of FIG. 1.

Referring now to FIG. 4, a second preferred embodiment of a power combiner 200 is illustrated. The combiner 200 includes phasing lines 202 and a transforming line 204 which is connected to an output node 206. The output node 206 is connected to a load resistor 208. The phasing lines 202 are each connected to one of a set of input nodes 210 which support and are coupled to a set of amplifiers 104. The phasing transmission lines 202 each have a length of one/half wavelength and each have a characteristic impedance of about 50 Ohms. The transforming line 204 is coupled to each of the phasing lines 202 at one end and is coupled to the output node 206 at the other end. The transforming line 204 has a length of one-quarter wavelength. In the preferred embodiment, the transforming line 204 has a characteristic impedance determined in accordance with the formula shown in FIG. 4. The characteristic impedance of the transforming line is calculated by dividing the load resistor impedance by the fourth root of the product of the minimum number of amplifiers connectable to the set of inputs 210 and the maximum number of amplifiers connectable to the inputs 210.

Those skilled in the art will appreciate that some applications will be more suitable for using the combiner 120, and other applications will be more suitable to the combiner 200. One factor in determining whether to use the combiner 120 or the combiner 200 will be the calculated length and the characteristic impedance of the transforming line 204. In some applications the characteristic impedance of the transforming line 204 may be too small to be implemented with existing transmission line technology. In this case, the combiner 120 illustrated in FIG. 2 should be used instead. Also, those skilled in the art will appreciate that any of the transmission lines described herein may be produced according to well known transmission line technology, such as strip line technology. Preferably, considering practical size constraints, the transmission line technology chosen should be suitable for applications with a frequency greater than 200 megahertz.

Figure 5:
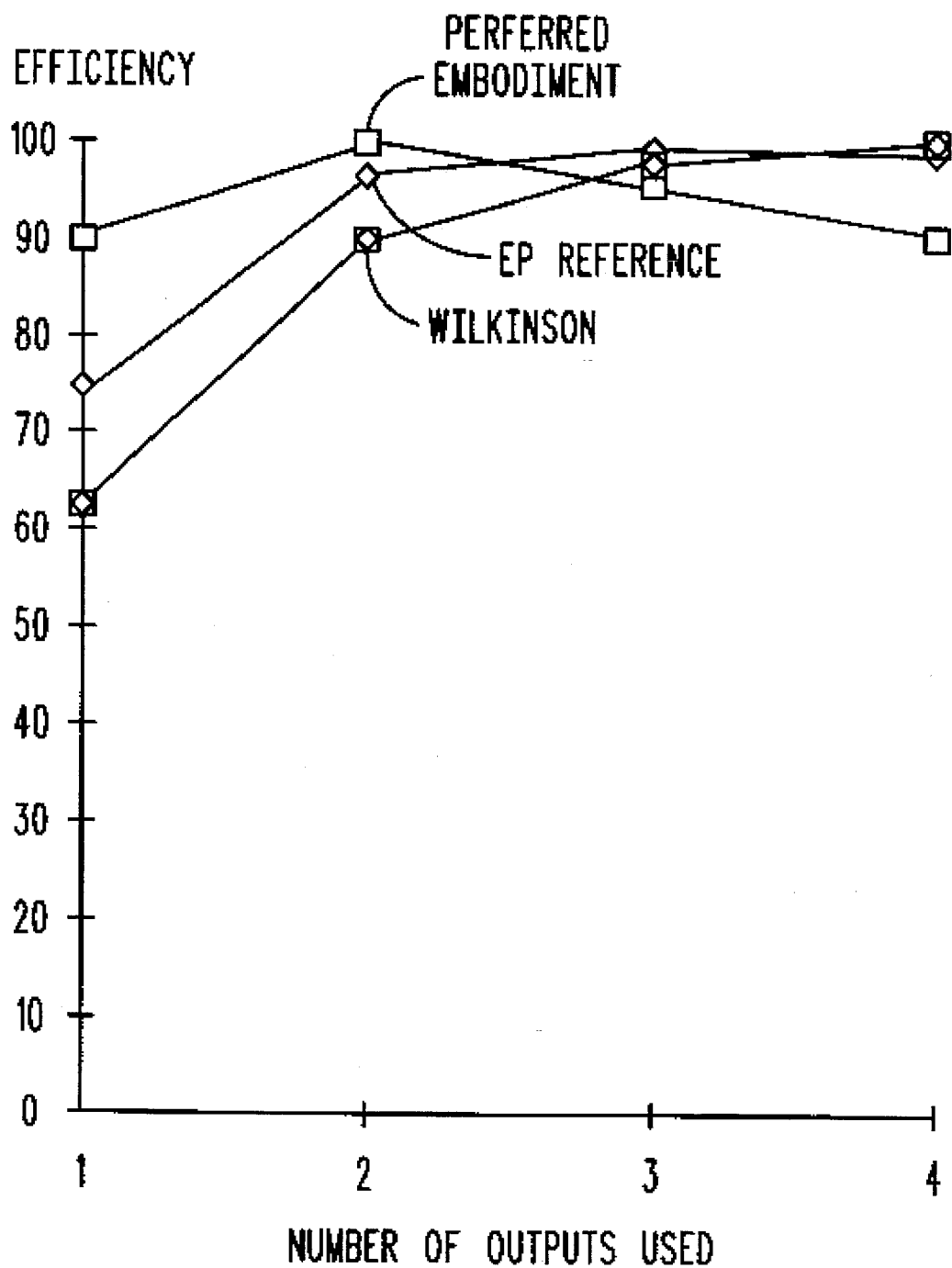
FIG. 5 is a graph illustrating improved efficiency of the preferred embodiment with respect to prior art devices.

The preferred embodiments have many advantages. For example, the preferred combiner maintain a high efficiency across a range of amplifiers that are coupled to the combiner. More specifically, FIG. 5 illustrates a comparison of efficiency between the preferred embodiment and the prior art devices of Wilkinson and the '286 patent. The preferred embodiment maintains an efficiency above eighty-nine percent while the prior art devices have a worst case efficiency between 60–75%. Thus, the preferred embodiment provides more consistent performance across the entire range.

In addition, further advantages and modifications will readily occur to those skilled in the art. The invention, in its broader aspects, is therefore not limited to the specific details, representative apparatus, and illustrative examples shown and described herein. Various modifications and variations can be made to the above specification without varying from the scope or spirit of the invention, and it is intended that the present invention cover all such modifications and variations provided they come within the scope of the following claims and their equivalents.

What is claimed is:

1. A power combiner for use in a radio frequency system comprising:

a plurality of phasing transmission lines supporting a set of amplifiers coupled thereto, said set having a selectable number of amplifiers between a minimum and a maximum; and a plurality of matching transmission lines, each of the matching transmission lines having a first and second end, said first end coupled to one of the phasing lines and said second end coupled to a common node and each matching transmission line having a substantially equivalent characteristic impedance determined according to a function of the minimum and the maximum selectable number of amplifiers in said set of amplifiers.

2. The power combiner of claim 1, wherein each of said phasing transmission lines has a length of a quarter of a wavelength.

3. The power combiner of claim 2, wherein said length comprises an odd multiple of a quarter of a wavelength.

4. The power combiner of claim 1, wherein said function comprises the fourth root of the product of the minimum number and the maximum selectable number of amplifiers in the set.

5. The power combiner of claim 1, wherein said combiner is configured as a combining power amplifier, said common node is coupled to a resistive output load, and said phasing transmission lines each have a characteristic impedance substantially equal to an impedance of the resistive output load.

6. The power combiner of claim 1, wherein said power amplifier is configured as a dividing power amplifier.

7. The power combiner of claim 1, wherein said minimum number is two, said maximum number is four, and said characteristic impedance is between about eighty to about ninety ohms.

8. The power combiner of claim 1, wherein said matching transmission lines each have a length which is a multiple of one fourth of a wavelength.

9. The power combiner of claim 8, wherein said length is an odd multiple of one fourth of a wavelength.

10. A method of constructing a power combiner for use in a radio frequency system comprising the steps of:

providing a plurality of parallel phasing transmission lines supporting a set of amplifiers coupled thereto, said set having a selectable number of amplifiers between a minimum and a maximum;

providing a plurality of matching transmission lines, each of the matching transmission lines having a first and second end, said first end coupled to one of the phasing lines and said second end coupled to a common node, and each of the matching transmission lines having a substantially equivalent characteristic impedance; and determining the characteristic impedance according to a nonlinear function of the minimum and the maximum selectable number of amplifiers in said set of amplifiers.

11. The method of claim 10, wherein said nonlinear function comprises a fourth root of the product of the minimum number and the maximum number of amplifiers in the set.

12. The method of claim 10, wherein said radio frequency system comprises an extended linear power amplifier system.

13. The method of claim 10, wherein said radio frequency system comprises a base site of a radiotelephone system.

14. A power combiner for use in a radio frequency system comprising:

a plurality of parallel phasing transmission lines supporting a set of amplifiers coupled thereto, said set having a selectable number of amplifiers between a minimum and a maximum value, each of said phasing transmission lines having a length substantially equal to one half of a wavelength or a multiple thereof; and a transforming line coupled to each of the phasing lines at one end and having a characteristic impedance determined according to a function of the minimum and the maximum number of amplifiers in said set of amplifiers.

15. The power combiner of claim 14, wherein said transforming line is coupled to a resistive output load and said phasing transmission lines each have a characteristic impedance substantially equal to the impedance of the output load.

16. The power combiner of claim 14, wherein said length is substantially equal to a multiple of one half wave length.

17. The power combiner of claim 14, wherein said function comprises a reciprocal of the fourth root of the product of the minimum number and the maximum selectable number of amplifiers in the set.

18. The power combiner of claim 14, wherein the length of said transforming line is one quarter of a wavelength.

* * * * *